(12) United States Patent
Lv et al.

(10) Patent No.: US 12,368,144 B2
(45) Date of Patent: Jul. 22, 2025

(54) DRIVING BACKPLANE, TRANSFER METHOD FOR LIGHT-EMITTING DIODE CHIP, DISPLAY APPARATUS

(71) Applicant: BOE Technology Group Co., Ltd., Beijing (CN)

(72) Inventors: Zhijun Lv, Beijing (CN); Feng Zhang, Beijing (CN); Wenqu Liu, Beijing (CN); Xiaoxin Song, Beijing (CN); Zhao Cui, Beijing (CN); Liwen Dong, Beijing (CN); Detian Meng, Beijing (CN); Libo Wang, Beijing (CN); Dongfei Hou, Beijing (CN); Lizhen Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 501 days.

(21) Appl. No.: 17/922,139

(22) PCT Filed: May 14, 2021

(86) PCT No.: PCT/CN2021/093886
§ 371 (c)(1),
(2) Date: Oct. 28, 2022

(87) PCT Pub. No.: WO2021/238681
PCT Pub. Date: Dec. 2, 2021

(65) Prior Publication Data
US 2023/0215851 A1    Jul. 6, 2023

(30) Foreign Application Priority Data
May 25, 2020  (CN) .......................... 202010447024.7

(51) Int. Cl.
*H01L 25/16*  (2023.01)
*H01F 7/06*  (2006.01)
(Continued)

(52) U.S. Cl.
CPC ........... *H01L 25/167* (2013.01); *H01F 7/064* (2013.01); *H01F 7/20* (2013.01); *H01L 24/05* (2013.01);
(Continued)

(58) Field of Classification Search
None
See application file for complete search history.

(56) References Cited

U.S. PATENT DOCUMENTS 11,296,268 B1 *  4/2022  Sengül ................... H01L 24/94
2016/0211415 A1   7/2016  Huang et al.
(Continued)

FOREIGN PATENT DOCUMENTS

CN      106170849 A     11/2016
CN      109801868 A     5/2019
(Continued)

OTHER PUBLICATIONS

CN202010447024.7 first office action.
PCT/CN2021/093886 international search report.

*Primary Examiner* — William C Trapanese
(74) *Attorney, Agent, or Firm* — IPro, PLLC

(57) ABSTRACT

A driving backplane, a transfer method for a light-emitting diode chip (21), and a display apparatus. The driving backplane comprises: a base substrate (10), a driving circuit, a plurality of electromagnetic structures (13), and a plurality of contact electrodes (12). The plurality of electromagnetic structures (13) in the driving backplane are symmetrically arranged relative to a first straight line (L1) and a second straight line (L2). A current signal can be applied to each electromagnetic structure (13) by means of the driving circuit. Stress generated by a transfer carrier plate (20) according to the magnetic force of each electromagnetic structure (13) moves the transfer carrier plate (20). When the transfer carrier plate (20) is stress balanced in each direction (Continued)

parallel to the surface of the transfer carrier plate (20), the light-emitting diode chip (21) is precisely aligned to corresponding contact electrodes (12).

20 Claims, 9 Drawing Sheets

(51) Int. Cl.
  *H01F 7/20* (2006.01)
  *H01L 23/00* (2006.01)
  *H10D 86/40* (2025.01)
  *H10D 86/60* (2025.01)
  *H10H 20/01* (2025.01)
(52) U.S. Cl.
  CPC ........... *H01L 24/95* (2013.01); *H10D 86/441* (2025.01); *H10D 86/60* (2025.01); *H10H 20/018* (2025.01); *H01L 24/06* (2013.01); *H01L 24/29* (2013.01); *H01L 24/83* (2013.01); *H01L 2224/05573* (2013.01); *H01L 2224/06131* (2013.01); *H01L 2224/2957* (2013.01); *H01L 2224/29611* (2013.01); *H01L 2224/29639* (2013.01); *H01L 2224/83201* (2013.01); *H01L 2224/95133* (2013.01); *H01L 2224/95136* (2013.01)

(56) References Cited

U.S. PATENT DOCUMENTS

| | | |
|---|---|---|
| 2018/0053751 A1 | 2/2018 | Zou et al. |
| 2020/0294975 A1* | 9/2020 | Xuan .................... H10D 86/60 |
| 2021/0074689 A1 | 3/2021 | Mai et al. |
| 2021/0257527 A1* | 8/2021 | Torrents Abad ........ H01L 24/00 |

FOREIGN PATENT DOCUMENTS

| | | |
|---|---|---|
| CN | 110323309 A | 10/2019 |
| CN | 110364607 A | 10/2019 |
| CN | 110400861 A | 11/2019 |
| CN | 110416139 A | 11/2019 |
| CN | 111584519 A | 8/2020 |

* cited by examiner

```
┌─────────────────────────────────────────────────────────────┐
│ Providing a transfer carrier plate; wherein a surface of the │
│ transfer carrier plate has a plurality of light-emitting     │
│ diode chips, each of the light-emitting diode chips          │
│ comprises two extraction electrodes, and the two extraction  │── S301
│ electrodes are on a side of the light-emitting diode chip    │
│ facing away from the transfer carrier plate; and magnetizing │
│ the two extraction electrodes of the light-emitting diode    │
│ chip so that magnetism of all the extraction electrodes is   │
│ the same                                                     │
└─────────────────────────────────────────────────────────────┘
                              ▼
┌─────────────────────────────────────────────────────────────┐
│ Moving the transfer carrier plate onto the driving           │
│ backplane, wherein the surface of the transfer carrier       │── S302
│ plate having the plurality of light-emitting diode chips is  │
│ opposite to a surface of the driving backplane having the    │
│ contact electrodes                                           │
└─────────────────────────────────────────────────────────────┘
                              ▼
┌─────────────────────────────────────────────────────────────┐
│ Supplying a current signal to each of the electromagnetic    │
│ structures of the driving backplane after performing a first │── S303
│ alignment between the transfer carrier plate and the driving │
│ backplane by using alignment marks, so that the              │
│ electromagnetic structure generates a magnetic field having  │
│ a same magnetism as the extraction electrodes                │
└─────────────────────────────────────────────────────────────┘
                              ▼
┌─────────────────────────────────────────────────────────────┐
│ Applying a pressure to the transfer carrier plate, so that   │
│ the transfer carrier plate approaches the driving backplane  │
│ and a certain distance is between the transfer carrier plate │
│ and the driving backplane; moving the transfer carrier plate │── S304
│ according to stress generated by a detected magnetic force   │
│ of the electromagnetic structures for the transfer carrier   │
│ plate; stopping moving the transfer carrier plate when the   │
│ transfer carrier plate is under stress balance in each       │
│ direction parallel to the surface of the transfer carrier    │
│ plate, so that a second alignment between the transfer       │
│ carrier plate and the driving backplane is completed         │
└─────────────────────────────────────────────────────────────┘
                              ▼
┌─────────────────────────────────────────────────────────────┐
│ Stopping supplying the current signal to the electromagnetic │
│ structure, so that the magnetic field of the electromagnetic │── S305
│ structure disappears; performing heating and press fit on    │
│ the transfer carrier plate and the driving backplane so that │
│ the extraction electrodes are fixedly connected to the       │
│ corresponding contact electrodes; and separating the         │
│ transfer carrier plate from the light-emitting diode chips   │
│ and removing the transfer carrier plate                      │
└─────────────────────────────────────────────────────────────┘
```

Fig. 6

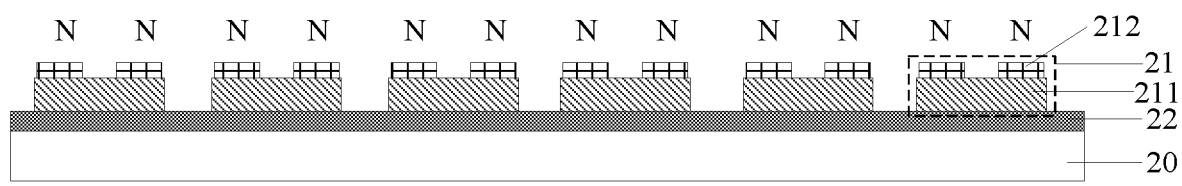
Fig. 7
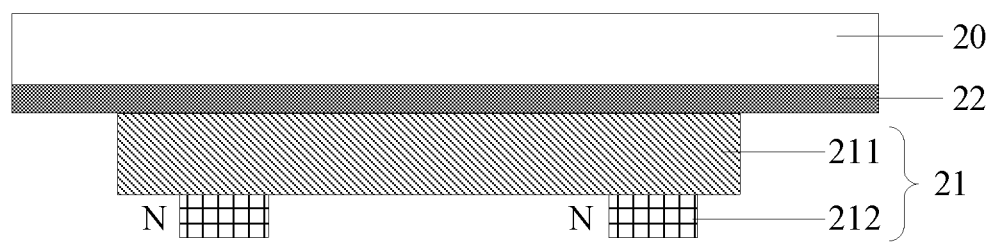
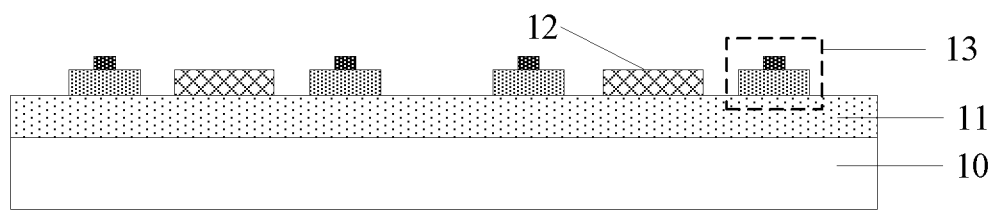
Fig. 8

DRIVING BACKPLANE, TRANSFER METHOD FOR LIGHT-EMITTING DIODE CHIP, DISPLAY APPARATUS

CROSS REFERENCE TO RELATED APPLICATIONS

The present disclosure is a National Stage of International Application No. PCT/CN2021/093886, filed on May 14, 2021, which claims priority to the Chinese Patent Application No. 202010447024.7, filed to the China National Intellectual Property Administration on May 25, 2020, the entire contents of which are incorporated herein by reference.

FIELD

The present disclosure relates to the technical field of display, in particular to a driving backplane, a transfer method for a light-emitting diode chip, and a display apparatus.

BACKGROUND

A light-emitting diode chip is a semiconductor diode which can convert electric energy to optical energy. The light-emitting diode chip has characteristics of being small in size, high in brightness, small in energy consumption and the like, thereby being widely applied to the fields of a display screen, a backlight source, illumination and the like.

A micro light-emitting diode (Micro-LED) chip is a light-emitting diode chip with its size within 100 micrometers. In general, after fabrication of the micro light-emitting diode chip is finished, a mass transfer process needs to be performed, specifically, a large quantity (usually tens of thousands or even hundreds of thousands) of micro light-emitting diode chips are transferred onto a driving circuit board. However, at present, a transfer precision of the micro light-emitting diode chip is low, which leads to a low yield of a display apparatus.

SUMMARY

In a first aspect, an embodiment of the present disclosure provides a driving backplane, including: a base substrate; a plurality of contact electrodes on a side of the base substrate, wherein the plurality of contact electrodes are distributed in array in a first direction and a second direction and define a display region, and the first direction intersects with the second direction; a plurality of electromagnetic structures on a side of the base substrate, wherein the plurality of electromagnetic structures are symmetrically arranged relative to a first straight line and a second straight line, the first straight line is a straight line where a center line of the display region in the first direction is located, and the second straight line is a straight line where a center line of the display region in the second direction is located; and a driving circuit between the base substrate and a layer where the contact electrodes are located, wherein the driving circuit is electrically connected to each of the electromagnetic structures and configured to supply a current signal to the electromagnetic structure during an alignment process of transferring a light-emitting diode chip so that the electromagnetic structure generates a magnetic field having the same magnetism as the light-emitting diode chip, and stop supplying the current signal to the electromagnetic structure after alignment is completed, so that the light-emitting diode chip makes contact with the contact electrodes corresponding to the light-emitting diode chip under an action of a pressure.

In a possible implementation, in the driving backplane provided by an embodiment of the present disclosure, in a region of at least part of the display region, at least four of the electromagnetic structures symmetrically arranged relative to the contact electrodes are arranged around the contact electrodes.

In a possible implementation, in the driving backplane provided by the embodiment of the present disclosure, four of the electromagnetic structures symmetrically arranged relative to each of the contact electrodes are arranged around each of the contact electrodes.

In a possible implementation, in the driving backplane provided by the embodiment of the present disclosure, the driving backplane includes at least four alignment regions in an edge region and symmetrically arranged relative to the first straight line and the second straight line; the edge region is a region beyond the display region; and the electromagnetic structures are arranged in all the alignment regions.

In a possible implementation, in the driving backplane provided by the embodiment of the present disclosure, each of the electromagnetic structures includes: a conductive column and a conductive coil surrounding the conductive column; and an extension direction of the conductive column is perpendicular to a surface of the driving backplane.

In a possible implementation, in the driving backplane provided by the embodiment of the present disclosure, the conductive coil includes: a plurality of sub-coils stacked; each of the electromagnetic structure further includes: an insulation layer between sub-coils which are adjacent to each other; and the sub-coils which are adjacent to each other are electrically connected with each other through a through hole in the insulation layer.

In a possible implementation, in the driving backplane provided by the embodiment of the present disclosure, the driving circuit includes: a thin film transistor; and at least part of the sub-coils of the conductive coil is in a same layer as a source electrode and a gate electrode of the thin film transistor.

In a second aspect, an embodiment of the present disclosure further provides a display apparatus, including: the above driving backplane, and the plurality of light-emitting diode chips bound to the plurality of contact electrodes of the driving backplane.

In a third aspect, an embodiment of the present disclosure further provides a transfer method for a light-emitting diode chip, including: providing a transfer carrier plate; wherein a surface of the transfer carrier plate has a plurality of light-emitting diode chips, each of the light-emitting diode chips includes two extraction electrodes, and the two extraction electrodes are on a side of the light-emitting diode chip facing away from the transfer carrier plate; magnetizing the two extraction electrodes of the light-emitting diode chip so that magnetism of all the extraction electrodes is the same; moving the transfer carrier plate onto the driving backplane, wherein the surface of the transfer carrier plate having the plurality of light-emitting diode chips is opposite to a surface of the driving backplane having the contact electrodes; supplying a current signal to each of the electromagnetic structures of the driving backplane after performing a first alignment between the transfer carrier plate and the driving backplane by using alignment marks, so that the electromagnetic structure generates a magnetic field having a same magnetism as the extraction electrodes; applying a pressure to the transfer carrier plate, so that the transfer carrier plate approaches the driving backplane and a certain distance is between the transfer carrier plate and the driving backplane; moving the transfer carrier plate according to stress generated by a detected magnetic force of the electromagnetic structures for the transfer carrier plate; stopping moving the transfer carrier plate when the transfer carrier plate is under stress balance in each direction parallel to the surface of the transfer carrier plate, so that a second alignment between the transfer carrier plate and the driving backplane is completed; stopping supplying the current signal to the electromagnetic structure, so that the magnetic field of the electromagnetic structure disappears; performing heating and press fit on the transfer carrier plate and the driving backplane so that the extraction electrodes are fixedly connected to the corresponding contact electrodes; and separating the transfer carrier plate from the light-emitting diode chips and removing the transfer carrier plate.

In a possible implementation, in the transfer method provided by the embodiment of the present disclosure, the surface of the transfer carrier plate has a pyrolytic adhesive; the plurality of light-emitting diode chips are glued to the transfer carrier plate through the pyrolytic adhesive; and the separating the transfer carrier plate from the light-emitting diode chips includes: heating the transfer carrier plate to reduce viscosity of the pyrolytic adhesive so that the transfer carrier plate is separated from the light-emitting diode chips.

In a possible implementation, in the transfer method provided by the embodiment of the present disclosure, the surface of the transfer carrier plate has a photolytic adhesive; the plurality of light-emitting diode chips are glued to the transfer carrier plate through the photolytic adhesive; and the separating the transfer carrier plate from the light-emitting diode chips includes: irradiating the photolytic adhesive by using a light ray within a set wavelength range to reduce viscosity of the photolytic adhesive so that the transfer carrier plate is separated from the light-emitting diode chips.

In a possible implementation, in the transfer method provided by the embodiment of the present disclosure, the providing a transfer carrier plate includes: forming multiple light-emitting diode chips on a wafer, wherein the extraction electrodes of each of the multiple light-emitting diode chips are on a side of the multiple light-emitting diode chips facing away from the wafer; detecting each of the multiple light-emitting diode chips on the wafer; moving the wafer onto a middle carrier plate, wherein a surface of the wafer having the multiple light-emitting diode chips faces the middle carrier plate, and light-emitting diode chips which are qualified after detection are transferred onto the middle carrier plate; and transferring the light-emitting diode chips which are qualified on the middle carrier plate onto the transfer carrier plate so that the extraction electrodes of each of the light-emitting diode chips which are qualified are located on a side of each of the light-emitting diode chips which are qualified facing away from the transfer carrier plate.

BRIEF DESCRIPTION OF THE DRAWINGS

FIG. 6 is a flowchart of a transfer method for a light-emitting diode chip provided by an embodiment of the present disclosure.

FIG. 7 to FIG. 9, FIG. 11 and FIG. 12 are corresponding schematic structural diagrams of all steps of a transfer method in an embodiment of the present disclosure.

DETAILED DESCRIPTION OF THE EMBODIMENTS

Specific to a problem of low transfer precision of micro light-emitting diode chips in the related art, embodiments of the present disclosure provide a driving backplane, a transfer method for a light-emitting diode chip, and a display apparatus.

Specific implementations of the driving backplane, the transfer method for the light-emitting diode chip, and the display apparatus provided by the embodiments of the present disclosure are described in detail below with reference to the accompanying drawings. A thickness and a shape of each film layer in the accompanying drawings do not reflect a true scale but only intend to illustrate contents of the present disclosure.

Figure 1:
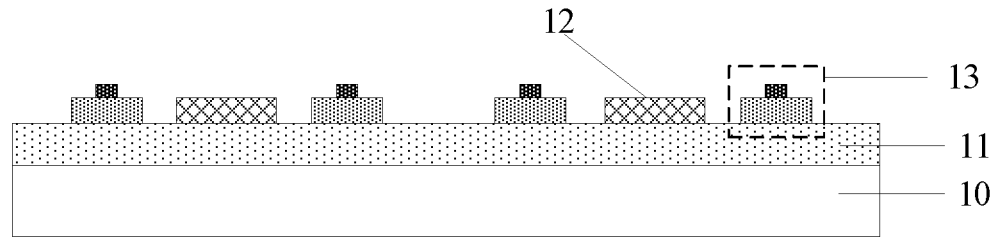
FIG. 1 is a schematic structural sectional view of a driving backplane provided by an embodiment of the present disclosure.
Figure 2:
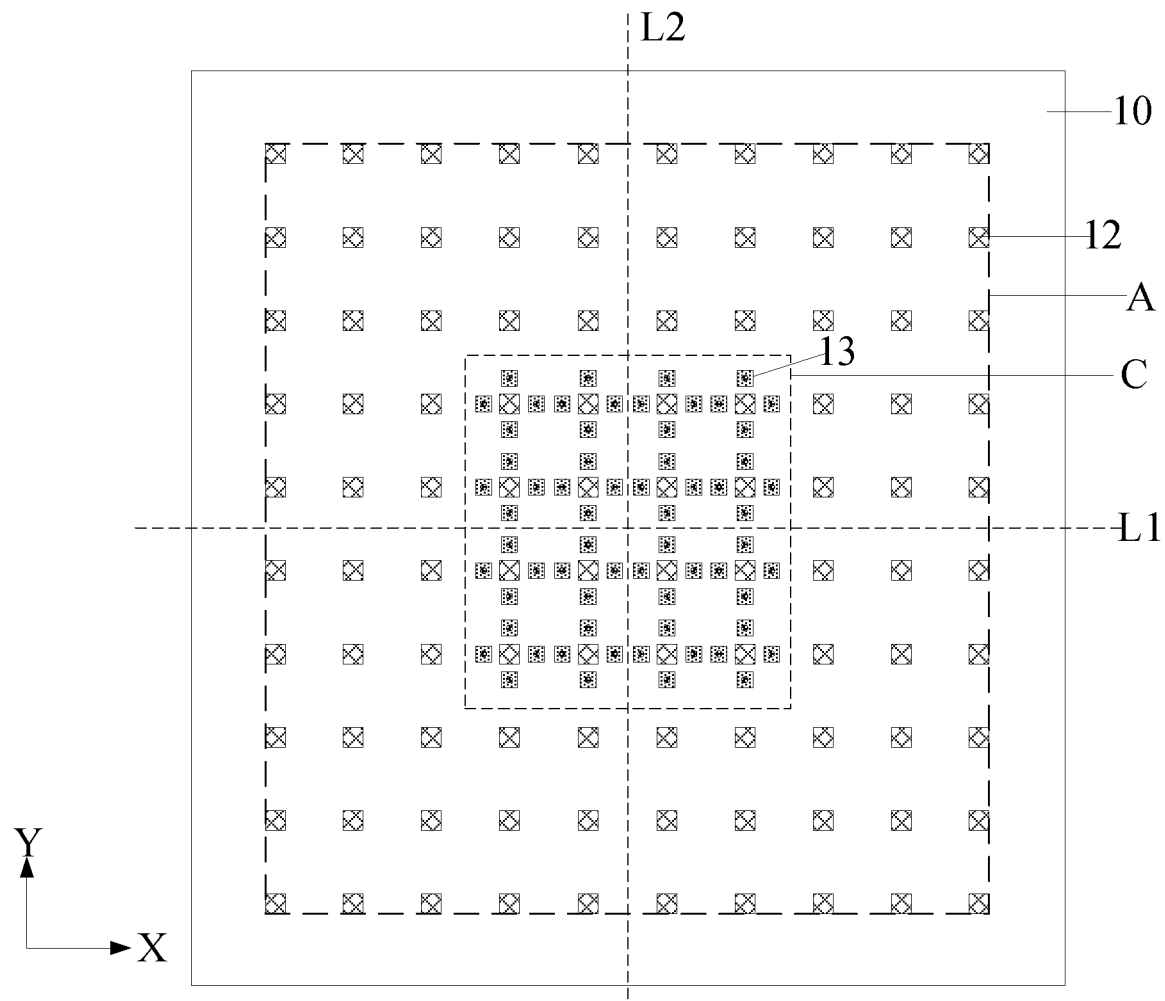
FIG. 2 is a schematic structural top view of a driving backplane provided by an embodiment of the present disclosure.

An embodiment of the present disclosure provides a driving backplane. FIG. 1 is a schematic structural sectional view of a driving backplane provided by an embodiment of the present disclosure. FIG. 2 is a schematic structural top view of a driving backplane provided by an embodiment of the present disclosure. As shown in FIG. 1 and FIG. 2, the driving backplane includes: a base substrate 10, a driving circuit 11 and a plurality of electromagnetic structures 13 on the base substrate 10, and a plurality of contact electrodes 12 on a side of the driving circuit 11 facing away from the base substrate 10.

The plurality of contact electrodes 12 of the driving backplane are distributed in array in a first direction X and a second direction Y, the first direction X intersects with the second direction Y, and the plurality of contact electrodes 12 of the driving backplane define a display region A.

The plurality of electromagnetic structures 13 of the driving backplane are symmetrically arranged relative to a first straight line L1 and a second straight line L2. The first straight line L1 is a straight line where a center line of the display region A in the first direction X is located, and the second straight line L2 is a straight line where a center line of the display region A in the second direction Y is located.

The driving circuit 11 are electrically connected to all the electromagnetic structures 13 and configured to supply a current signal to each electromagnetic structure 13 during an alignment process of transferring a light-emitting diode chip so that each electromagnetic structure 13 generates a magnetic field that has the same magnetism as the light-emitting diode chip, and stop supplying the current signal to each electromagnetic structure 13 after alignment is completed so that the light-emitting diode chip makes contact with the corresponding contact electrodes 12 under an action of a pressure.

In the driving backplane provided by the embodiment of the present disclosure, the plurality of electromagnetic structures are arranged on the base substrate, the plurality of electromagnetic structures of the driving backplane are symmetrically arranged relative to the first straight line and the second straight line, during the alignment process of the transferring the light-emitting diode chip, the current signal may be supplied to each electromagnetic structure by means of the driving circuit, so that each electromagnetic structure generates the magnetic field that has the same magnetism as the light-emitting diode chip, the transfer carrier plate is moved according to stress generated by a magnetic force of each electromagnetic structure for the transfer carrier plate, the light-emitting diode chip can be accurately aligned to the corresponding contact electrodes when the transfer carrier plate is under stress balance in each direction parallel to a surface of the transfer carrier plate, so that a transfer precision of the light-emitting diode chip is improved.

In the embodiment of the present disclosure, the light-emitting diode chip may be a micro light-emitting diode chip with a size being smaller than 100 micrometers, or may also be a light-emitting diode chip with other sizes, which is not limited here. During actual application, light-emitting diode chips are formed on a wafer, and a gap between all light-emitting diode chips on the wafer may be the same as or in a multiple relationship with a gap between the contact electrodes of the driving backplane. Each light-emitting diode chip usually includes an epitaxial structure and two extraction electrodes. The embodiment of the present disclosure makes a description by taking the two extraction electrodes of the light-emitting diode chip being located on the same side of the epitaxial structure of the light-emitting diode chip as an example, and during specific implementation, the two extraction electrodes of the light-emitting diode chip may also be on two sides of the epitaxial structure of the light-emitting diode chip.

As shown in FIG. 2, the plurality of contact electrodes 12 of the driving backplane are distributed in array in the first direction X and the second direction Y, and the figure makes an illustration by taking the first direction X and the second direction Y being perpendicular to each other as an example. During specific implementation, the first direction X and the second direction Y may also be not perpendicular, which is not limited here. The driving circuit 11 is electrically connected to each of the contact electrodes 12, and each contact electrode 12 may correspond to one extraction electrode in each light-emitting diode chip. After the light-emitting diode chips are transferred onto the driving backplane, a driving signal may be supplied to each contact electrode 12 through the driving circuit 11, so as to realize image display. Besides, the driving circuit 11 is electrically connected to each electromagnetic structure 13, so that the current signal may be supplied to each electromagnetic structure 13 through the driving circuit 11, so each electromagnetic structure 13 generates a magnetic field, and the magnetism of the magnetic field generated by the electromagnetic structure 13 may be controlled by controlling a current direction.

In order to facilitate subsequent electrical connection between the light-emitting diode chips and the driving backplane, the light-emitting diode chips formed on the wafer need to be transferred onto the transfer carrier plate, the light-emitting diode chips on the transfer carrier plate correspond to the contact electrodes of the driving backplane in position, then the light-emitting diode chips on the transfer carrier plate are transferred onto the driving backplane, and thus electrical connection between the light-emitting diode chips and the driving backplane is realized.

In a process of transferring the light-emitting diode chips on the transfer carrier plate onto the driving backplane, a first alignment between the transfer carrier plate and the driving backplane is performed by using an alignment mark, so the light-emitting diode chips are closer to the corresponding contact electrodes. The plurality of electromagnetic structures 13 of the driving backplane are symmetrically arranged relative to the first straight line L1 and the second straight line L2, and the magnetism of the magnetic field generated by each electromagnetic structure 13 is the same as magnetism of each light-emitting diode chip on the transfer carrier plate, so according to a principle that the same pole repels each other, when the transfer carrier plate reaches balance stress in a direction parallel to a surface of the transfer carrier plate, a second alignment between the transfer carrier plate and the driving backplane is completed, the light-emitting diode chips are located over the corresponding contact electrodes, and accurate alignment between the light-emitting diode chips and the contact electrodes is realized. All the electromagnetic structures of the driving backplane are symmetrically arranged relative to the first straight line and the second straight line, and in a process of the second alignment, the transfer carrier plate stops moving only when the transfer carrier plate reaches balance stress at least in the first direction X and the second direction Y. Besides, the transfer carrier plate reaching balance stress in the direction parallel to the surface of the transfer carrier plate may be understood as the stress borne by the transfer carrier plate in the direction is approximately balanced, that is, the balance stress is reached within a certain error range.

Besides, in order to conveniently align the light-emitting diode chips to the corresponding contact electrodes, a size of each contact electrode may be set to be larger than a size of each extraction electrode of the light-emitting diode chip, so as to prevent a connection failure caused by alignment deviation.

During specific implementation, in the above driving backplane provided by the embodiment of the present disclosure, each electromagnetic structure may be arranged in at least two modes as follows.

Mode 1

As shown in FIG. 2, in a region C of at least part of the display region A, at least four electromagnetic structures 13 symmetrically arranged relative to each of the contact electrodes 12 are arranged around the contact electrode 12.

FIG. 2 makes an illustration by taking arranging the electromagnetic structures 13 in the region C as an example, in the region C, four electromagnetic structures 13 symmetrically arranged may be arranged around each of the contact electrodes 12, and during specific implementation, more electromagnetic structures 13 may also be arranged around each of the contact electrodes 12, which is not limited here.

Figure 3:
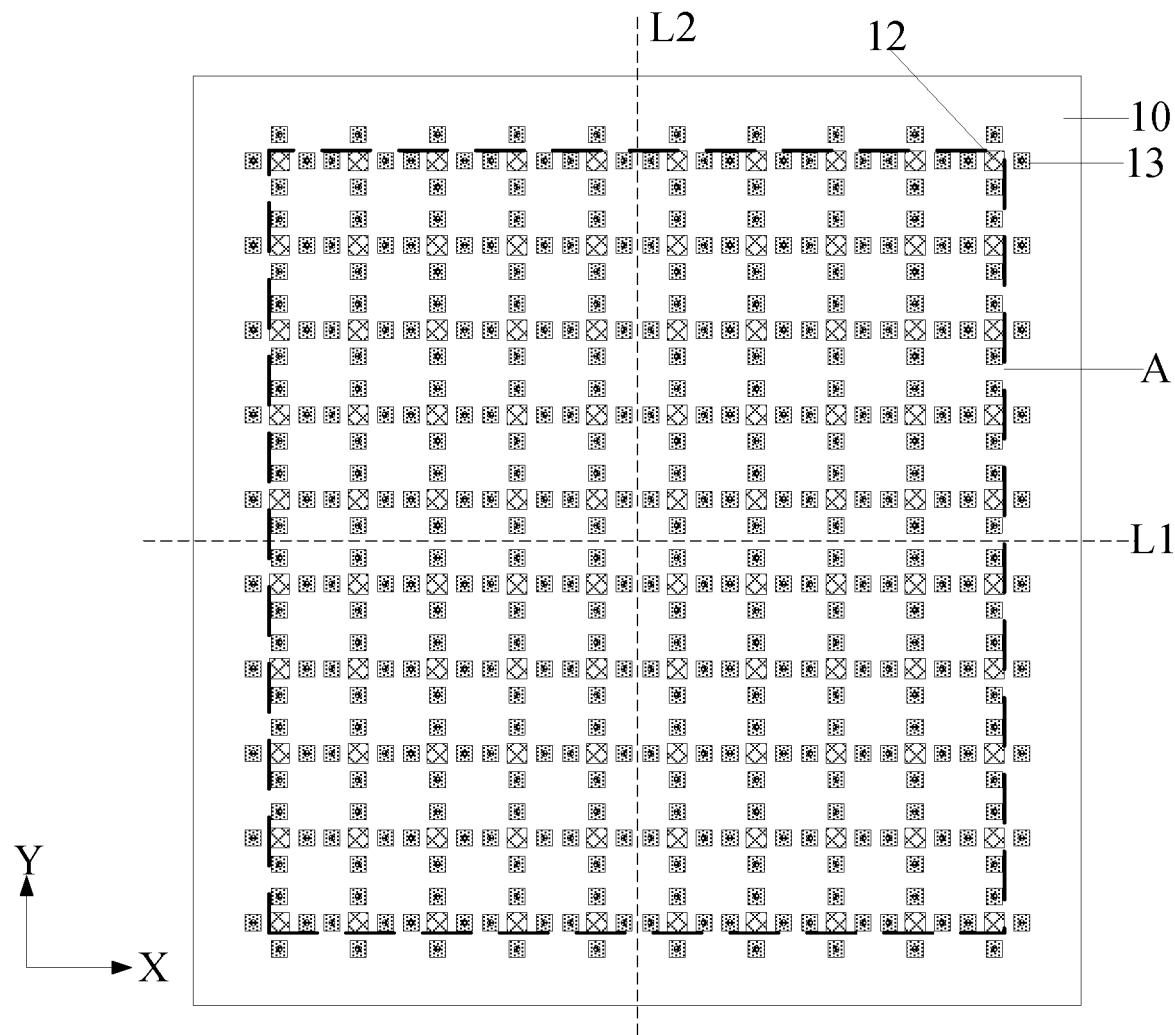
FIG. 3 is another schematic structural top view of a driving backplane provided by an embodiment of the present disclosure.

FIG. 2 makes an illustration by taking the region C being located in a middle position of the display region A as an example, during specific implementation, the region C may also be located in other positions, for example, the region C may include two sub-regions arranged relative to the first straight line L1. Or as shown in FIG. 3, the region C may also coincide with the display region A, that is, the electromagnetic structures 13 may be arranged around each contact electrode 12 in the display region A. FIG. 3 takes four electromagnetic structures 13 around each of the contact electrodes 12 as an example. During specific implementation, other quantities of electromagnetic structures 13 may also be arranged around the contact electrode 12. Besides, the adjacent contact electrodes 12 may also share the electromagnetic structure 13, distribution of the electromagnetic structures 13 is not limited here and may be set according to actual conditions during specific implementation as long as the plurality of electromagnetic structures 13 of the driving backplane are symmetrically arranged relative to the first straight line L1 and the second straight line L2.

Mode 2

Figure 4:
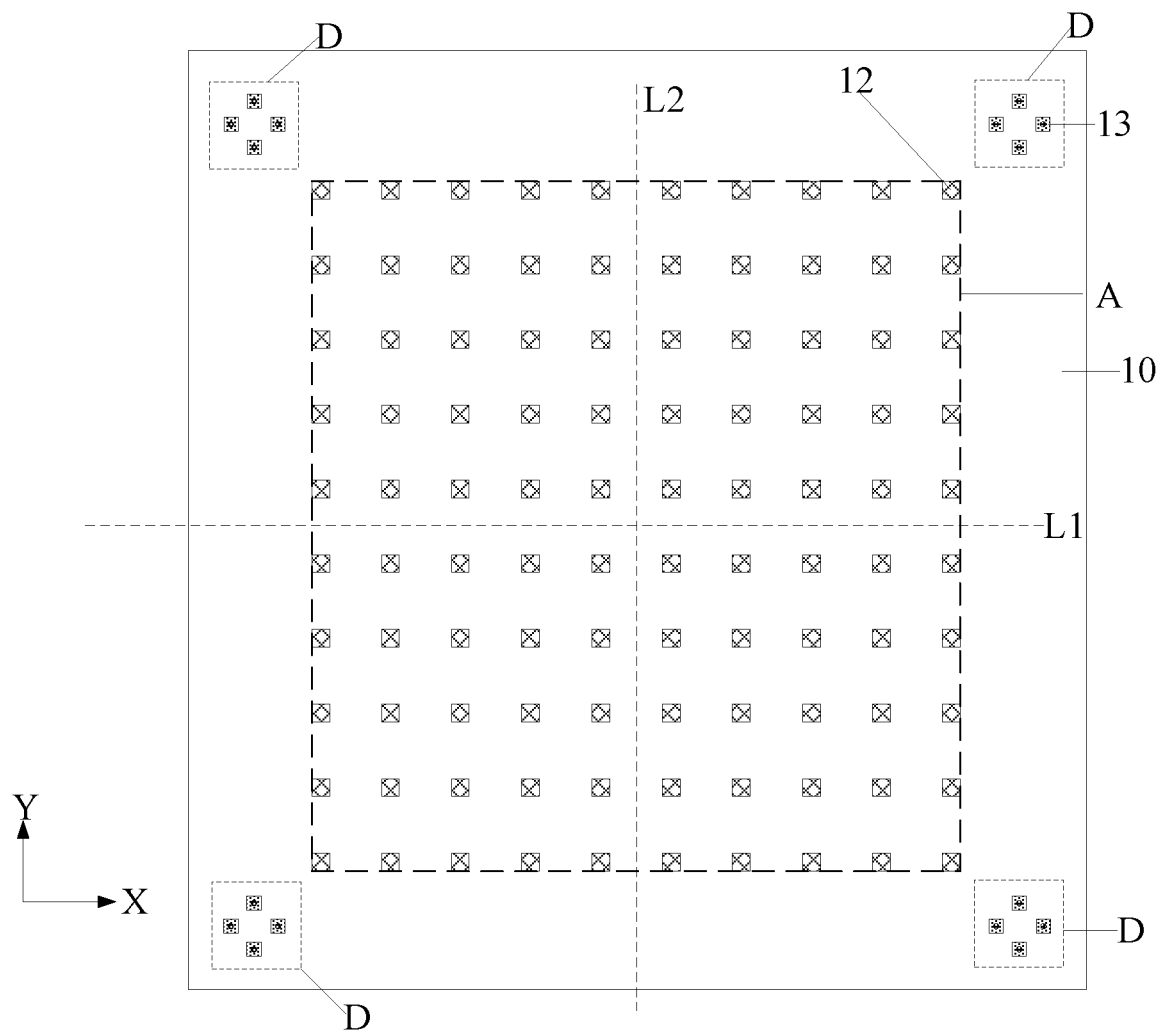
FIG. 4 is another schematic structural top view of a driving backplane provided by an embodiment of the present disclosure.

As shown in FIG. 4, the driving backplane includes at least four alignment regions D located in an edge region and symmetrically arranged relative to the first straight line L1 and the second straight line L2, and the edge region is a region beyond the display region A.

The electromagnetic structure 13 is arranged in each alignment region D.

In FIG. 4, an illustration is made by taking four electromagnetic structures 13 being arranged in the alignment region D as an example. During specific implementation, other quantities of electromagnetic structures 13 may also be arranged in the alignment region D, which is not limited here. During specific implementation, the electromagnetic structures may be arranged in the alignment regions D according to actual conditions as long as the plurality of electromagnetic structures 13 of the driving backplane are symmetrically arranged relative to the first straight line L1 and the second straight line L2.

During actual application, the electromagnetic structures 13 of the driving backplane may be arranged according to a needed magnetic force, arrangements may be performed only by using mode 1 or only by using mode 2, or by combining mode 1 and mode 2, that is, the electromagnetic structures 13 are arranged both in the display region A and the edge region, which is not limited here.

It should be noted that in order to clearly implement a structure of the driving backplane, FIG. 2 to FIG. 4 make illustrations by using a limited quantity of contact electrodes but do not limit the quantity and a distribution mode of the contact electrodes, and during specific implementation, the quantity and the distribution mode of the contact electrodes may be set according to actual demands.

Figure 5:
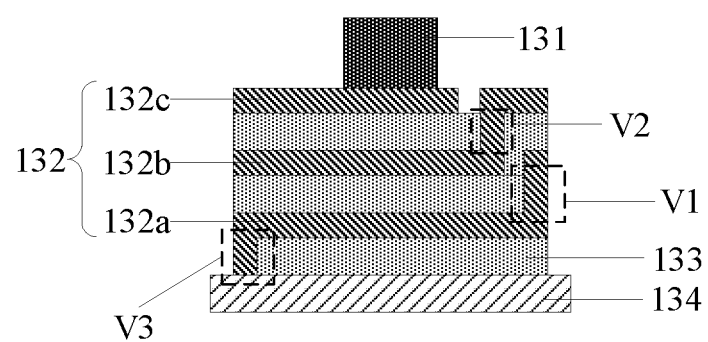
FIG. 5 is a schematic enlarged diagram of an electromagnetic structure.

Specifically, in the above driving backplane provided by the embodiment of the present disclosure, FIG. 5 is a schematic enlarged diagram of an electromagnetic structure, as shown in FIG. 5. The electromagnetic structure includes: a conductive column 131, and a conductive coil 132 surrounding the conductive column 131.

An extension direction of the conductive column 131 is perpendicular to a surface of the driving backplane.

The conductive column 131 and the conductive coil 132 are arranged and a current signal is supplied to the conductive coil 132, so the conductive column 131 may generate a magnetic pole. Specifically, a material of the conductive coil 132 may be one or a combination of indium tin oxide (ITO), molybdenum (Mo), copper (Cu), aluminum (Al) or argentum (Ag). A material of the conductive column 131 may be a metal material, for example, iron.

Specifically, in the above driving backplane provided by the embodiment of the present disclosure, as shown in FIG. 5, the conductive coil 132 includes: a plurality of sub-coils stacked.

The electromagnetic structure further includes: an insulation layer 133 between the sub-coils which are adjacent to each other.

The two adjacent sub-coils are electrically connected with each other through a through hole in the insulation layer 133.

FIG. 5 makes an illustration by taking the conductive coil 132 including the sub-coils 132a, 132b and 132c as an example. During specific implementation, the conductive coil 132 may also include other quantities of sub-coils, which is not limited here. As shown in FIG. 5, the sub-coil 132a is electrically connected to the sub-coil 132b through the through hole V1, and the sub-coil 132b is electrically connected to the sub-coil 132c through the through hole V2.

Besides, the electromagnetic structure may also include a connection terminal 134, and the electromagnetic structure may be electrically connected to the driving circuit through the connection terminal 134. The connection terminal 134 may be electrically connected to the conductive coil 132 through the through hole V3 in the insulation layer 133.

During specific implementation, in the above driving backplane provided by the embodiment of the present disclosure, the driving circuit may include: a thin film transistor.

At least part of sub-coils of the conductive coil is in the same layer as a source electrode and a gate electrode of the thin film transistor.

At least part of sub-coils of the conductive coil is in the same layer as the source electrode and the gate electrode so that in a fabrication process, the sub-coils, the source electrode and the gate electrode may be fabricated by using the same patterning process at the same time, thus process steps can be saved, and fabrication cost is reduced. Besides, the insulation layer in the electromagnetic structure may also be in the same layer as an insulation layer in the driving circuit so as to further reduce the fabrication cost.

In addition, each sub-coil and each insulation layer in the electromagnetic structure may also be fabricated layer by layer after fabrication of the driving circuit is completed.

Based on the same inventive concept, an embodiment of the present disclosure further provides a display apparatus, including: the above driving backplane, and a plurality of light-emitting diode chips bound to all the contact electrodes of the driving backplane. The display apparatus may be a mobile phone, a tablet computer, a television, a display, a notebook computer, a digital photo frame, navigator and any other products or components with a display function. A principle of solving a problem of the display apparatus is similar to the above driving backplane, so implementation of the display apparatus may refer to implementation of the above driving backplane, and repetitions are omitted.

In a third aspect, based on the same inventive concept, an embodiment of the present disclosure further provides a transfer method for a light-emitting diode chip. A principle for solving a problem of the transfer method is similar to the above driving backplane, so implementation of the transfer method may refer to implementation of the above driving backplane, and repetitions are omitted.

The transfer method for the light-emitting diode chip provided by the embodiment of the present disclosure, as shown in FIG. 6, includes the following.

S301, as shown in FIG. 7, a transfer carrier plate 20 is provided, wherein a surface of the transfer carrier plate 20 has a plurality of light-emitting diode chips 21, each light-emitting diode chip 21 includes two extraction electrodes 212, the extraction electrodes 212 are on a side of the light-emitting diode chip 21 facing away from the transfer carrier plate 20; the extraction electrodes 212 of each light-emitting diode chip 21 is magnetized, so that magnetism of all the extraction electrodes 212 is the same, which takes the magnetism of each extraction electrode 212 being an N-pole as an example.

S302, as shown in FIG. 8, the transfer carrier plate 20 is moved onto the above driving backplane. The surface of the transfer carrier plate 20 having the light-emitting diode chips 21 is opposite to a surface of the driving backplane having contact electrodes 12. In order to more clearly illustrate a transfer process of the light-emitting diode chips, FIG. 8, FIG. 9, FIG. 11 and FIG. 12 make illustrations by taking the transfer process of only one light-emitting diode chip as an example.

Figure 9:
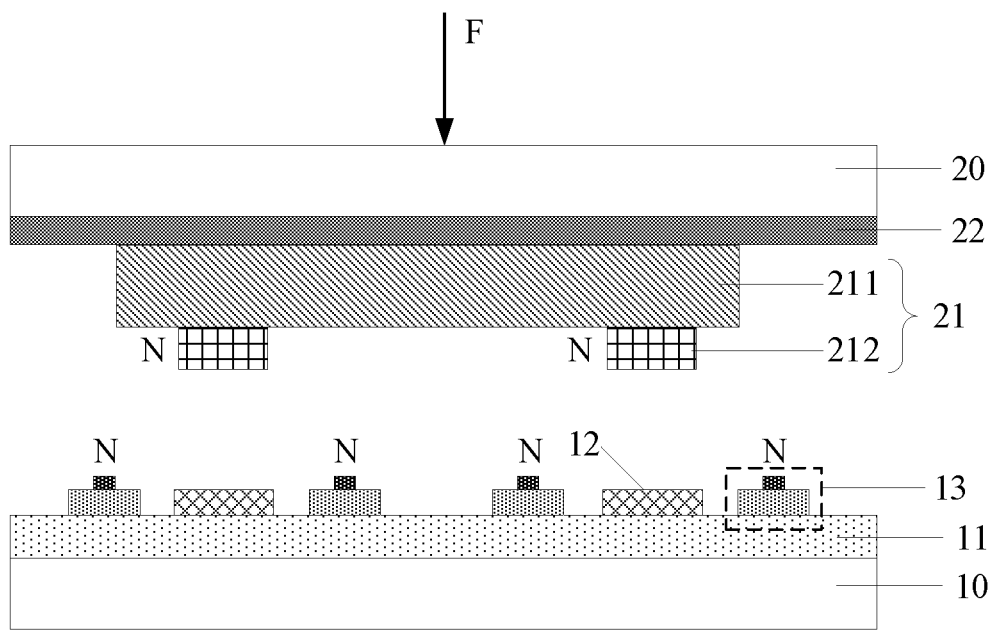

S303, a current signal is supplied to each electromagnetic structure 13 of the driving backplane, after a first alignment between the transfer carrier plate and the driving backplane is performed by using an alignment mark as shown in FIG. 9, so that each electromagnetic structure 13 generates a magnetic field that has the same magnetism as the extraction electrodes 212, which takes the magnetic field generated by each electromagnetic structure 13 being an N-pole as an example.

S304, also refer to FIG. 9, a pressure F is applied to the transfer carrier plate 20 so that the transfer carrier plate 20 approaches the driving backplane, and there is a certain distance between the transfer carrier plate 20 and the driving backplane; the transfer carrier plate 20 is moved according to detected stress generated by a magnetic force of each electromagnetic structure 13 for the transfer carrier plate 20; the transfer carrier plate 20 stops moving when the transfer carrier plate 20 is under stress balance in each direction parallel to a surface of the transfer carrier plate 20, so that a second alignment between the transfer carrier plate 20 and the driving backplane is completed.

Figure 11:
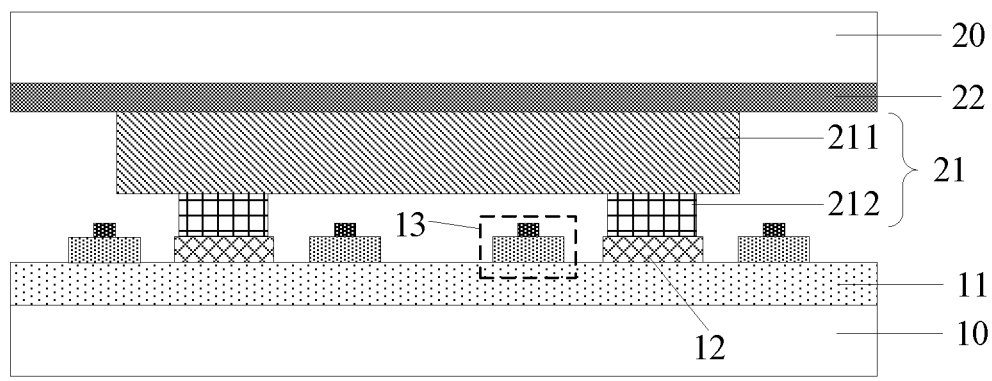
Figure 12:
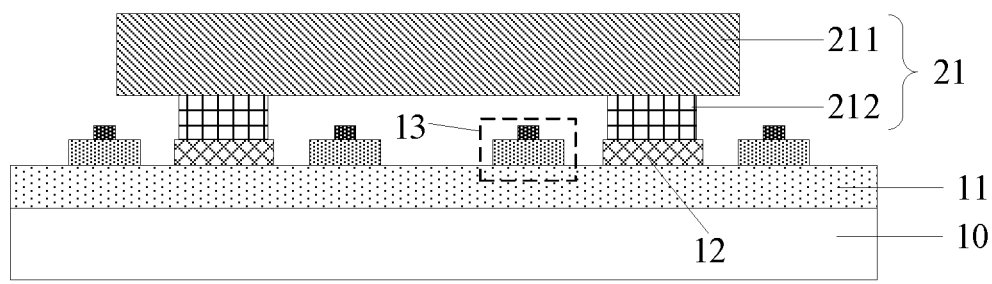

S305, the current signal supplied to each electromagnetic structure is stopped, so that the magnetic field of each electromagnetic structure disappears; refer to FIG. 11, heating and press fit are performed on the transfer carrier plate 20 and the driving backplane so that the extraction electrodes 212 are fixedly connected to the corresponding contact electrodes 12; and the transfer carrier plate 20 is separated from each light-emitting diode chip 21 and the transfer carrier plate 20 is removed so as to obtain a structure shown in FIG. 12.

By means of the transfer method for the light-emitting diode chip provided by the embodiment of the present disclosure, during the alignment process of transferring the light-emitting diode chip, the current signal may be supplied to each electromagnetic structure by means of the driving circuit, so that each electromagnetic structure generates the magnetic field that has the same magnetism as the light-emitting diode chips. The transfer carrier plate is moved according to the stress generated by the magnetic force of each electromagnetic structure for the transfer carrier plate. The light-emitting diode chips can be accurately aligned to the corresponding contact electrodes when the transfer carrier plate is under stress balance in each direction parallel to the surface of the transfer carrier plate. Thus a transfer precision of the light-emitting diode chips is improved, moreover, the transfer method is simple in technical process, low in transfer cost, high in transfer efficiency and precision and suitable for needs of mass production.

In above step S301, the respective light-emitting diode chips 21 on the transfer carrier plate 20 correspond to the respective contact electrodes of the driving backplane in position respectively. Each light-emitting diode chip 21 may include an epitaxial structure 211 and the extraction electrodes 212. The two extraction electrodes 212 in the light-emitting diode chip 21 are on the same side of the epitaxial structure 211, and the extraction electrodes 212 are on a side of the epitaxial structure 211 facing away from the transfer carrier plate 20. During specific implementation, the transfer carrier plate may be put in a magnetic field of a strong magnet for a time duration so as to magnetize each extraction electrode 212.

Besides, a size of the transfer carrier plate may be consistent with a size of the driving backplane, moreover, all the light-emitting diode chips on the transfer carrier plate correspond to the contact electrodes of the driving backplane, so that the light-emitting diode chips on the transfer carrier plate may be transferred onto the driving backplane through a one-time transfer process. In addition, an assembling device for assembling a color film substrate and an array substrate in a fabrication process of a liquid crystal display apparatus may be adopted, thus process devices can be saved, and fabrication cost can be reduced.

In above step S303, alignment marks, in the transfer carrier plate and the driving backplane, corresponding in position may be arranged, and in the process of the first alignment, the transfer carrier plate and the driving backplane may be aligned by using the alignment marks. Each electromagnetic structure 13 may generate the magnetic field that has the same magnetism as the extraction electrode 212 by controlling a current direction of the current signal.

In above step S304, the electromagnetic structure 13 of the driving backplane has the magnetic field that has the same magnetism as the extraction electrode 212 on the transfer carrier plate 20, so the pressure F needs to be applied to the transfer carrier plate 20, so that the transfer carrier plate 20 approaches the driving backplane, and there is a certain distance between the transfer carrier plate 20 and the driving backplane.

Figure 10:
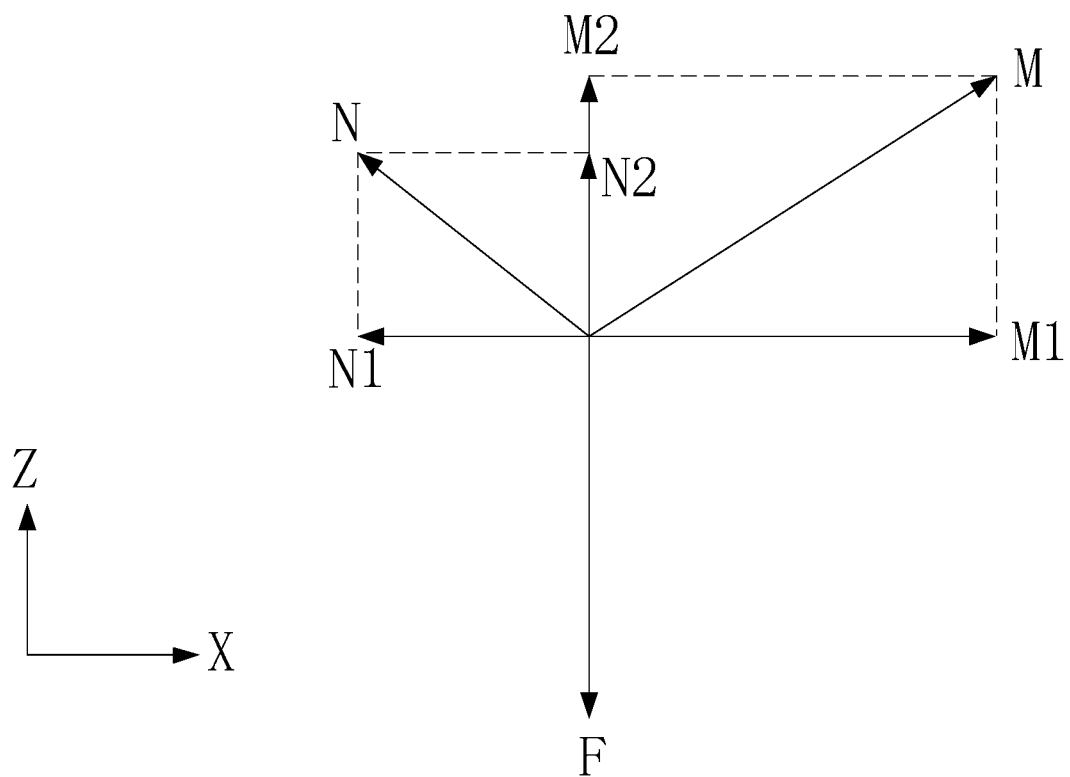
FIG. 10 is a schematic diagram of a stress analysis in a process of a second alignment of a transfer carrier plate.

FIG. 10 is a schematic diagram of a stress analysis of a transfer carrier plate in a process of a second alignment and makes an illustration by taking a stress situation of the transfer carrier plate in the first direction X as an example, a stress situation in other directions is similar to this, and a third direction Z in FIG. 10 may be a direction perpendicular to the surface of the transfer carrier plate. As shown in FIG. 10, the electromagnetic structures of the driving backplane are symmetrically arranged, so that in the process of the second alignment, each electromagnetic structure of the driving backplane generates a first stress M and a second stress N for the transfer carrier plate. A component force of the first stress M in the first direction X is M1, a component force of the first stress M in the second direction Y is M2, a component force of the second stress N in the first direction X is N1, and a component force of the second stress N in the second direction Y is N2. The component force M2 and the component force N2 may be balanced through the pressure F, so that the transfer carrier plate may approach the driving backplane and remain a certain distance from the driving backplane, and the transfer carrier plate may move in the direction parallel to the surface of the transfer carrier plate. Specifically, the transfer carrier plate may be moved according to magnitudes of the component force M1 and the component force N1, for example, in FIG. 10, the component force M1 is greater than the component force N1, so the transfer carrier plate may be moved leftwards for a corresponding distance, so as to reduce a difference between the component force M1 and the component force N1. When the component force M1 is approximately equal to the component force N1, it indicates that the transfer carrier plate is under stress balance in the first direction X. The electromagnetic structures of the driving backplane are symmetrically arranged relative to the first straight line and the second straight line, so in the process of the second alignment, the transfer carrier plate stops moving only when the stress borne by the transfer carrier plate reaches balance stress at least in the first direction X and the second direction Y, so that the second alignment between the transfer carrier plate and the driving backplane is completed.

During specific implementation, a pressure sensor(s) may be arranged on the transfer carrier plate, so as to detect a stress situation of the transfer carrier plate in all directions.

It should be noted that in the embodiment of the present disclosure, the transfer carrier plate being under stress balance in a certain direction may be understood as stress borne by the transfer carrier plate in the direction is approximately balanced, that is, the balance stress is reached within a certain error range.

In above step S305, after the second alignment is completed, positions between the transfer carrier plate and the driving backplane are locked, the current signal supplied to each electromagnetic structure is stopped, so the magnetic field of each electromagnetic structure disappears, the transfer carrier plate does not bear the action of the magnetic force of the electromagnetic structure, thus, the transfer carrier plate makes contact with the driving backplane under the action of the pressure, then the transfer carrier plate and the driving backplane are heated, and the pressure continues to be applied to the transfer carrier plate.

In a heating process, the magnetism of the extraction electrodes disappears, which is caused by a situation that magnetic moment directions of all magnetic domains of a magnetized material become inconsistent when being affected by external energy (such as heating and impacting), and consequently the magnetism is weakened or disappears. Thus in a heating process, energy absorbed by the extraction electrodes may increase electron kinetic energy, so motion of electrons speeds up, which disorganizes an original orderly electron arrangement, and the electrons cannot recover an orderly arrangement state after being cooled, so the magnetism disappears.

Besides, surfaces of the extraction electrodes or contact electrodes may be coated with a welding material in advance, for example, the welding material may be a conductive adhesive, a silver paste, a tin paste or other thermosetting materials, the surfaces of the extraction electrodes or the contact electrodes may be coated with the welding material in a printing mode. Under the action of heating and pressure, for example, the pressure may be controlled within a range of 0.1~0.5 Mpa, electrical connection between the extraction electrodes and the contact electrodes is completed, that is, the extraction electrodes are fixedly connected to the corresponding contact electrodes.

Specifically, in the above transfer method provided by the embodiment of the present disclosure, the surface of the transfer carrier plate has a pyrolytic adhesive, and the plurality of light-emitting diode chips are glued to the transfer carrier plate through the pyrolytic adhesive.

In above step S305, the separating the transfer carrier plate from each light-emitting diode chip includes: the transfer carrier plate is heated to reduce viscosity of the pyrolytic adhesive so that the transfer carrier plate is separated from the light-emitting diode chip.

As shown in FIG. 7, a gluing layer 22 on the surface of the transfer carrier plate 20 is the pyrolytic adhesive, the transfer carrier plate 20 is glued to the light-emitting diode chip 21 through the gluing layer 22. When the pyrolytic adhesive is heated, the viscosity of the pyrolytic adhesive is reduced, and the viscosity of the pyrolytic adhesive may be recovered after being cooled. In above step S305, refer to FIG. 11, the transfer carrier plate 20 is heated so that the viscosity of the pyrolytic adhesive can be reduced, thus the transfer carrier plate 20 is separated from the light-emitting diode chip 21, and after the transfer carrier plate 20 is removed, the structure shown in FIG. 12 is obtained. During specific implementation, in step S305, in the process of performing heating and press fit on the transfer carrier plate and the driving backplane, the viscosity of the pyrolytic adhesive on the surface of the transfer carrier plate may be reduced, and the heating process for the transfer carrier plate does not need to be added.

Or in above step S305, the separating the transfer carrier plate from each light-emitting diode chip includes: the surface of the transfer carrier plate has a photolytic adhesive, and the plurality of light-emitting diode chips are glued to the transfer carrier plate through the photolytic adhesive.

In above step S305, the separating the transfer carrier plate from each light-emitting diode chip includes: the photolytic adhesive is irradiated by using a light ray within a set wavelength range to reduce viscosity of the photolytic adhesive so that the transfer carrier plate is separated from the light-emitting diode chip.

As shown in FIG. 7, the gluing layer 22 on the surface of the transfer carrier plate 20 is the photolytic adhesive. The transfer carrier plate 20 is glued to the light-emitting diode chip 21 through the gluing layer 22. The viscosity of the photolytic adhesive is reduced when irradiated by the light ray within a set wavelength, and the viscosity of the photolytic adhesive may be recovered when being irradiated by light ways with other wavelengths. In above step S305, after performing heating and press fit on the transfer carrier plate and the driving backplane, a position of the transfer carrier plate having the photolytic adhesive may be irradiated by the light ray within the set wavelength range so as to reduce the viscosity of the photolytic adhesive, so the transfer carrier plate is separated from the light-emitting diode chip, specifically, the light ray with the set wavelength may be an ultraviolet light ray or an infrared light ray.

Besides, after above step S305, the light-emitting diode chip may also be encapsulated so as to prolong a service life of the light-emitting diode chip and prevent the light-emitting diode chip from affecting other components due to heating when emitting light. Specifically, materials such as silica gel or epoxy resin may be adopted, to form an encapsulation layer on the light-emitting diode chip. The encapsulation layer may be arranged as a whole layer or may cover only each light-emitting diode chip.

Figure 13:
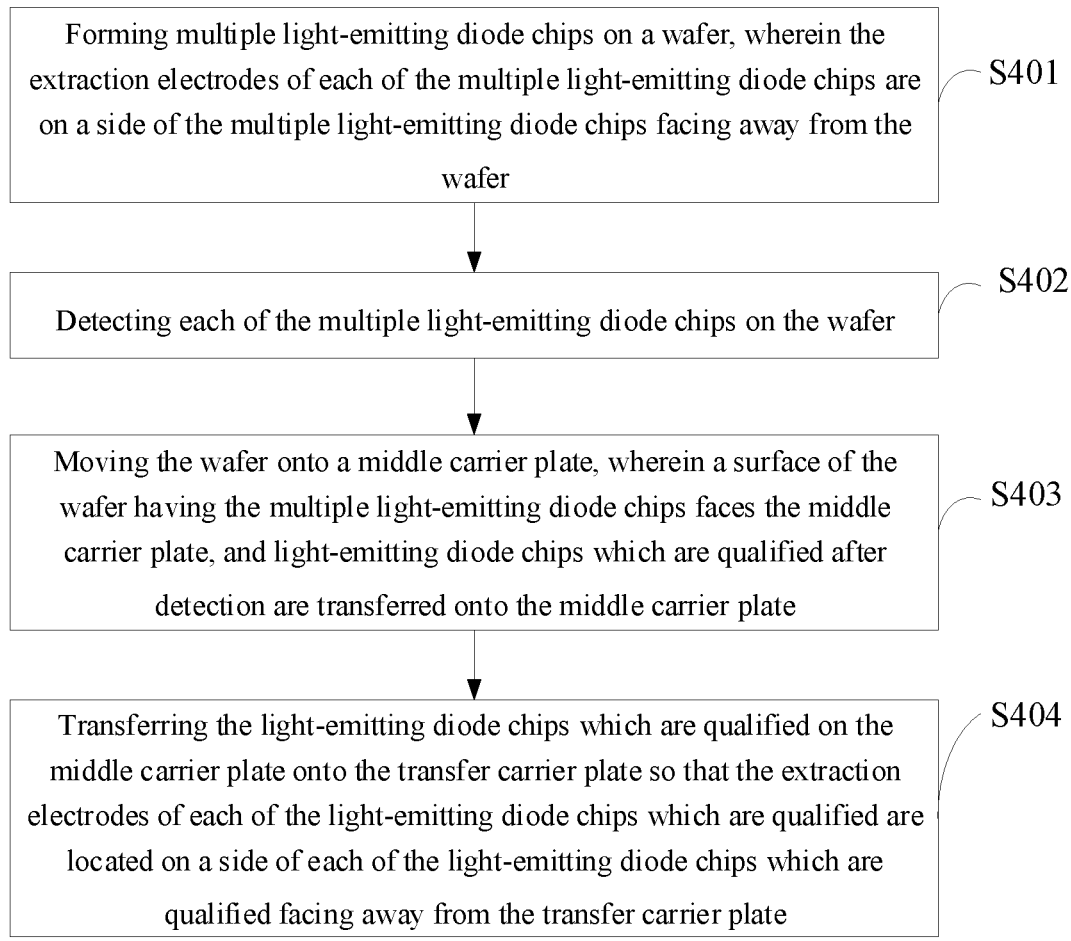
FIG. 13 is a schematic flowchart of a method for transferring a light-emitting diode chip onto a transfer carrier plate in an embodiment of the present disclosure.

During specific implementation, in the above transfer method provided by the embodiment of the present disclosure, as shown in FIG. 13, in above step S301, the proving a transfer carrier plate may include the following.

Figure 14:
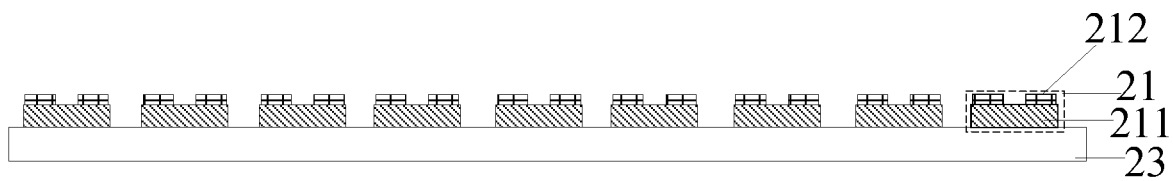
FIG. 14 to FIG. 16 are corresponding schematic structural diagrams of all steps in FIG. 13.

S401, refer to FIG. 14, multiple light-emitting diode chips 21 are formed on a wafer 23, wherein the extraction electrodes 212 of each of the multiple light-emitting diode chip 21 are on a side of the light-emitting diode chip 21 facing away from the wafer 23. In other words, in a technical process, the epitaxial structure 211 is grown on a surface of the wafer 23, and then the extraction electrodes 212 are formed on a surface of the epitaxial structure 211. During specific implementation, a gap between the adjacent light-emitting diode chips 21 on the wafer 23 is the same as or being in a multiple relationship with a gap between the adjacent contact electrodes of the driving backplane.

S402, each light-emitting diode chip 21 on the wafer 23 is detected. Specifically, each light-emitting diode chip may be excited to emit light by using optical excitation under the condition of not supplying an electrical signal to the light-emitting diode chip, so that whether the light-emitting diode chip can emit light normally is detected. Besides, a shape of the light-emitting diode chip can be detected by using an automatic optical detection device, the light-emitting diode chip in abnormal shape is recorded. Whether the light-emitting diode chips in all positions are qualified can be determined in the above two modes. A corresponding detection map may be generated according to a detection result so as to conveniently and fast inquire whether the light-emitting diode chips in all the positions are qualified subsequently.

Figure 15:
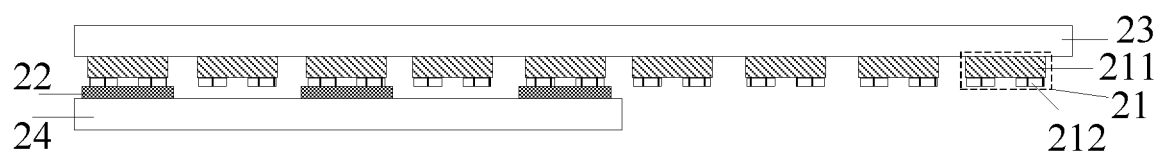

S403, refer to FIG. 15, the wafer 23 is moved onto a middle carrier plate 24. A surface of the wafer 23 having the light-emitting diode chips 21 faces the middle carrier plate 24, and light-emitting diode chips 21 which are qualified after detection are transferred onto the middle carrier plate 24.

A size of the middle carrier plate 24 may be greater than or equal to a size of the wafer 23, or the size of the middle carrier plate 24 may also be smaller than the size of the wafer 23. FIG. 15 makes an illustration by taking the size of the middle carrier plate 24 being smaller than the size of the wafer 23 as an example. The light-emitting diode chips on the wafer are transferred onto the middle carrier plate in a mode of repeated transfer. Moreover, in the transfer process, only the qualified light-emitting diode chips are transferred, the unqualified light-emitting diode chips are skipped. Thus the qualified light-emitting diode chips are screened out in the transfer process.

During specific implementation, a surface of the middle carrier plate 24 may be coated with a layer of gluing layer 22, for example, the gluing layer 22 is the photolytic adhesive or the pyrolytic adhesive. The viscosity of the photolytic adhesive is reduced under irradiation of the light ray with the set wavelength, and the viscosity of the photolytic adhesive may be recovered under irradiation of light rays with other wavelengths. The viscosity of the pyrolytic adhesive is reduced when being heated, and the viscosity of the pyrolytic adhesive is recovered after being cooled. The gluing layer 22 may be patterned so as to pick up the light-emitting diode chip 21 in a set a position on the wafer 23. For example, in FIG. 15, a pattern of the gluing layer 22 of the middle carrier plate 24 corresponds to light-emitting diode chips 21 in an odd number of columns (or even number of columns) on the wafer 23. Thus the middle carrier plate 24 picks up only the light-emitting diode chips 21 in an odd number of columns (or even number of columns) on the wafer 23.

Specifically, the wafer 23 is moved onto the middle carrier plate 24, and the light-emitting diode chips 21 make contact with and are glued to the gluing layer 22. Then the positions of the light-emitting diode chips 21 to be transferred are irradiated by a laser, so the light-emitting diode chips 21 are separated from the wafer 23. Besides, only the qualified light-emitting diode chips are transferred onto the middle carrier plate according to a detection result of the light-emitting diode chips in above step S402, that is, only the qualified light-emitting diode chips are irradiated by the laser. Thus a yield of the light-emitting diode chips is improved.

Figure 16:
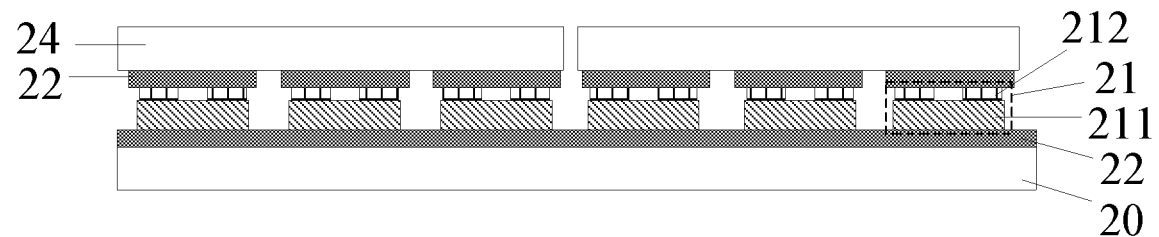

S404, refer to FIG. 16, the light-emitting diode chips 21 on the middle carrier plate 24 are transferred onto the transfer carrier plate 20, so that the extraction electrodes 212 of each light-emitting diode chip 21 are on the side of the light-emitting diode chip 21 facing away from the transfer carrier plate 20. FIG. 16 makes an illustration by taking the size of the middle carrier plate 24 being smaller than the size of the transfer carrier plate 20 as an example. In the transfer process, the light-emitting diode chips 21 may be transferred onto the transfer carrier plate 20 in the mode of repeated transfer or in a mode of a plurality of middle carrier plates 24.

Specifically, the surface of the transfer carrier plate 20 is coated with the gluing layer 22 (taking the gluing layer 22 being the pyrolytic adhesive as an example), and the middle carrier plate 24 is moved onto the transfer carrier plate 20. A surface of the middle carrier plate 24 having the light-emitting diode chips 21 is opposite to the surface of the transfer carrier plate 20 having the gluing layer 22. After the light-emitting diode chips 21 are glued to the gluing layer 22 on the surface of the transfer carrier plate 20, the gluing layer 22 on the middle carrier plate 24 is heated, so that the light-emitting diode chips 21 are separated from the middle carrier plate 24, and then the middle carrier plate 24 is removed so as to obtain a structure shown in FIG. 7.

In addition, during or after the process of above step S404, a broken position may be made up with a qualified light-emitting diode chip according to a detection result of step S402, so that all the light-emitting diode chips transferred onto the transfer carrier plate may be qualified light-emitting diode chips, and the yield of the light-emitting diode chips is improved.

In the embodiments of the present disclosure, before the light-emitting diode chips are transferred to the middle carrier plate, all the light-emitting diode chips on the wafer are detected, and in the subsequent transfer process, only the qualified light-emitting diode chips are transferred onto the middle carrier plate, so that the yield of the light-emitting diode chips is improved.

According to the driving backplane, the transfer method for the light-emitting diode chip, and the display apparatus provided by the embodiments of the present disclosure, the plurality of electromagnetic structures are arranged on the base substrate, the plurality of electromagnetic structures of the driving backplane are symmetrically arranged relative to the first straight line and the second straight line, during the alignment process of transferring the light-emitting diode chip, the current signal may be supplied to each electromagnetic structure by means of the driving circuit, so that each electromagnetic structure generates the magnetic field that has the same magnetism as the light-emitting diode chip, the transfer carrier plate is moved according to the stress generated by the magnetic force of each electromagnetic structure for the transfer carrier plate, and when the transfer carrier plate is under stress balance in each direction parallel to the surface of the transfer carrier plate, the light-emitting diode chips can be accurately aligned to the corresponding contact electrodes, so that the transfer precision of the light-emitting diode chips is improved.

Apparently, those skilled in the art can make various changes and variations for the present disclosure without departing from the spirit and scope of the present disclosure. In this case, if these changes and variations for the present disclosure fall within the scope of claims of the present disclosure and their equivalents, the present disclosure also intends to contain these changes and variations.

What is claimed is:
1. A driving backplane, comprising:
a base substrate;
a plurality of contact electrodes on a side of the base substrate, wherein the plurality of contact electrodes are distributed in array in a first direction and a second direction and define a display region, and the first direction intersects with the second direction;

a plurality of electromagnetic structures on a side of the base substrate, wherein the plurality of electromagnetic structures are symmetrically arranged relative to a first straight line and a second straight line, the first straight line is a straight line where a center line of the display region in the first direction is located, and the second straight line is a straight line where a center line of the display region in the second direction is located; and a driving circuit between the base substrate and a layer where the contact electrodes are located, wherein the driving circuit is electrically connected to each of the electromagnetic structures and configured to supply a current signal to the electromagnetic structure during an alignment process of transferring a light-emitting diode chip so that the electromagnetic structure generates a magnetic field having the same magnetism as the light-emitting diode chip, and stop supplying the current signal to the electromagnetic structure after alignment is completed, so that the light-emitting diode chip makes contact with the contact electrodes corresponding to the light-emitting diode chip under an action of a pressure.

2. The driving backplane according to claim 1, wherein in at least part of the display region, at least four of the electromagnetic structures symmetrically arranged relative to each of the contact electrodes are arranged around the contact electrode.

3. The driving backplane according to claim 2, wherein four of the electromagnetic structures symmetrically arranged relative to each of the contact electrodes are arranged around each of the contact electrode.

4. The driving backplane according to claim 1, wherein the driving backplane includes at least four alignment regions in an edge region and symmetrically arranged relative to the first straight line and the second straight line; the edge region is a region beyond the display region; and the electromagnetic structures are arranged in all the alignment regions.

5. The driving backplane according to claim 1, wherein each of the electromagnetic structures comprises: a conductive column and a conductive coil surrounding the conductive column; and an extension direction of the conductive column is perpendicular to a surface of the driving backplane.

6. The driving backplane according to claim 5, wherein the conductive coil comprises: a plurality of sub-coils stacked;

each of the electromagnetic structure further comprises:
an insulation layer between sub-coils which are adjacent to each other; and
the sub-coils which are adjacent to each other are electrically connected with each other through a through hole in the insulation layer.

7. The driving backplane according to claim 6, wherein the driving circuit comprises: a thin film transistor; and
at least part of the sub-coils of the conductive coil is in a same layer as a source electrode and a gate electrode of the thin film transistor.

8. A display apparatus, comprising: the driving backplane according to claim 1, and the plurality of light-emitting diode chips bound to the plurality of contact electrodes of the driving backplane.

9. A transfer method for a light-emitting diode chip, comprising:

providing a transfer carrier plate; wherein a surface of the transfer carrier plate has a plurality of light-emitting diode chips, each of the light-emitting diode chips comprises two extraction electrodes, and the two extraction electrodes are on a side of the light-emitting diode chip facing away from the transfer carrier plate;

magnetizing the two extraction electrodes of the light-emitting diode chip so that magnetism of all the extraction electrodes is the same;

moving the transfer carrier plate onto the driving backplane according to claim 1, wherein the surface of the transfer carrier plate having the plurality of light-emitting diode chips is opposite to a surface of the driving backplane having the contact electrodes;

supplying a current signal to each of the electromagnetic structures of the driving backplane after performing a first alignment between the transfer carrier plate and the driving backplane by using alignment marks, so that the electromagnetic structure generates a magnetic field having a same magnetism as the extraction electrodes;

applying a pressure to the transfer carrier plate, so that the transfer carrier plate approaches the driving backplane and a certain distance is between the transfer carrier plate and the driving backplane;

moving the transfer carrier plate according to stress generated by a detected magnetic force of the electromagnetic structures for the transfer carrier plate;

stopping moving the transfer carrier plate when the transfer carrier plate is under stress balance in each direction parallel to the surface of the transfer carrier plate, so that a second alignment between the transfer carrier plate and the driving backplane is completed; and stopping supplying the current signal to the electromagnetic structure, so that the magnetic field of the electromagnetic structure disappears;

performing heating and press fit on the transfer carrier plate and the driving backplane so that the extraction electrodes are fixedly connected to the corresponding contact electrodes; and separating the transfer carrier plate from the light-emitting diode chips and removing the transfer carrier plate.

10. The transfer method according to claim 9, wherein the surface of the transfer carrier plate has a pyrolytic adhesive; the plurality of light-emitting diode chips are glued to the transfer carrier plate through the pyrolytic adhesive; and the separating the transfer carrier plate from the light-emitting diode chips comprises:

heating the transfer carrier plate to reduce viscosity of the pyrolytic adhesive so that the transfer carrier plate is separated from the light-emitting diode chips.

11. The transfer method according to claim 9, wherein the surface of the transfer carrier plate has a photolytic adhesive; the plurality of light-emitting diode chips are glued to the transfer carrier plate through the photolytic adhesive; and the separating the transfer carrier plate from the light-emitting diode chips comprises:

irradiating the photolytic adhesive by using a light ray within a set wavelength range to reduce viscosity of the photolytic adhesive so that the transfer carrier plate is separated from the light-emitting diode chips.

12. The transfer method according to claim 9, wherein the providing a transfer carrier plate comprises:

forming multiple light-emitting diode chips on a wafer, wherein the extraction electrodes of each of the multiple light-emitting diode chips are on a side of the multiple light-emitting diode chips facing away from the wafer;

detecting each of the multiple light-emitting diode chips on the wafer;

moving the wafer onto a middle carrier plate, wherein a surface of the wafer having the multiple light-emitting diode chips faces the middle carrier plate, and light-emitting diode chips which are qualified after detection are transferred onto the middle carrier plate; and transferring the light-emitting diode chips which are qualified on the middle carrier plate onto the transfer carrier plate so that the extraction electrodes of each of the light-emitting diode chips which are qualified are located on a side of each of the light-emitting diode chips which are qualified facing away from the transfer carrier plate.

13. The driving backplane according to claim 2, wherein each of the electromagnetic structures comprises: a conductive column and a conductive coil surrounding the conductive column; and an extension direction of the conductive column is perpendicular to a surface of the driving backplane.

14. The driving backplane according to claim 3, wherein each of the electromagnetic structures comprises: a conductive column and a conductive coil surrounding the conductive column; and an extension direction of the conductive column is perpendicular to a surface of the driving backplane.

15. The driving backplane according to claim 4, wherein each of the electromagnetic structures comprises: a conductive column and a conductive coil surrounding the conductive column; and an extension direction of the conductive column is perpendicular to a surface of the driving backplane.

16. The driving backplane according to claim 1, wherein one contact electrode of the plurality of contact electrodes corresponds to one extraction electrode of the light-emitting diode chip.

17. The driving backplane according to claim 1, wherein a size of each of the plurality of contact electrodes is larger than a size of each of extraction electrodes of the light-emitting diode chip.

18. The driving backplane according to claim 4, wherein 4 electromagnetic structures are arranged in each of the alignment regions.

19. The transfer method according to claim 10, wherein the providing a transfer carrier plate comprises:

forming multiple light-emitting diode chips on a wafer, wherein the extraction electrodes of each of the multiple light-emitting diode chips are on a side of the multiple light-emitting diode chips facing away from the wafer;

detecting each of the multiple light-emitting diode chips on the wafer;

moving the wafer onto a middle carrier plate, wherein a surface of the wafer having the multiple light-emitting diode chips faces the middle carrier plate, and light-emitting diode chips which are qualified after detection are transferred onto the middle carrier plate; and transferring the light-emitting diode chips which are qualified on the middle carrier plate onto the transfer carrier plate so that the extraction electrodes of each of the light-emitting diode chips which are qualified are located on a side of each of the light-emitting diode chips which are qualified facing away from the transfer carrier plate.

20. The transfer method according to claim 11, wherein the providing a transfer carrier plate comprises:

forming multiple light-emitting diode chips on a wafer, wherein the extraction electrodes of each of the multiple light-emitting diode chips are on a side of the multiple light-emitting diode chips facing away from the wafer;

detecting each of the multiple light-emitting diode chips on the wafer;

moving the wafer onto a middle carrier plate, wherein a surface of the wafer having the multiple light-emitting diode chips faces the middle carrier plate, and light-emitting diode chips which are qualified after detection are transferred onto the middle carrier plate; and transferring the light-emitting diode chips which are qualified on the middle carrier plate onto the transfer carrier plate so that the extraction electrodes of each of the light-emitting diode chips which are qualified are located on a side of each of the light-emitting diode chips which are qualified facing away from the transfer carrier plate.

* * * * *